US012701924B2

(12) United States Patent
Park et al.

(10) Patent No.: US 12,701,924 B2
(45) Date of Patent: Aug. 4, 2026

(54) MEMORY STRUCTURE WITH NON-ION BEAM ETCHED MTJ AND TOP ELECTRODE

(71) Applicant: International Business Machines Corporation, Armonk, NY (US)

(72) Inventors: Chanro Park, Clifton Park, NY (US); Koichi Motoyama, Clifton Park, NY (US); Hsueh-Chung Chen, Cohoes, NY (US); Yann Mignot, Slingerlands, NY (US); Daniel Worledge, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 703 days.

(21) Appl. No.: 18/062,380

(22) Filed: Dec. 6, 2022

(65) Prior Publication Data

US 2024/0188447 A1     Jun. 6, 2024

(51) Int. Cl.
| | |
|---|---|
| H10N 50/01 | (2023.01) |
| G11C 11/16 | (2006.01) |
| H10B 61/00 | (2023.01) |
| H10N 50/80 | (2023.01) |

(52) U.S. Cl.
CPC .......... H10N 50/01 (2023.02); G11C 11/161 (2013.01); H10B 61/00 (2023.02); H10N 50/80 (2023.02)

(58) Field of Classification Search
CPC ...... G11C 11/161; H10B 61/00; H10N 50/80; H10N 50/10
See application file for complete search history.

(56) References Cited

U.S. PATENT DOCUMENTS

| | | | |
|---|---|---|---|
| 6,153,443 A | 11/2000 | Durlam et al. | |
| 6,399,486 B1 * | 6/2002 | Chen ................. | H01L 21/76882 |
| | | | 257/E21.175 |
| 6,864,175 B2 | 3/2005 | Engelhardt et al. | |
| 7,842,601 B2 | 11/2010 | Lee et al. | |
| 7,955,870 B2 | 6/2011 | Ditizio | |
| 8,772,888 B2 | 7/2014 | Jung et al. | |
| 8,975,088 B2 | 3/2015 | Satoh et al. | |
| 11,127,788 B2 | 9/2021 | Niu et al. | |
| 2010/0123175 A1 | 5/2010 | Kanaya | |

(Continued)

FOREIGN PATENT DOCUMENTS

| | | |
|---|---|---|
| JP | 2003086772 A | 3/2003 |
| JP | 3843795 B2 | 11/2006 |

(Continued)

OTHER PUBLICATIONS

Song, Y. S., et al. "Wet Etch Characteristics of NiFe and CoFe Magnetic Thin Films", J. Ind. Eng. Chem., Mar. 2004, pp. 215-219, vol. 10, No. 2.

*Primary Examiner* — Shih Tsun A Chou
(74) *Attorney, Agent, or Firm* — Scully, Scott, Murphy & Presser, P.C.; Yuanmin Cai

(57)     ABSTRACT
A memory structure including a magnetic tunnel junction (MTJ) structure and a top electrode that are both formed without utilizing ion beam etching is provided. The MTJ structure, which includes a lower magnetic stack, a tunnel barrier layer and an upper magnetic stack, is pyramidal shaped, and end portions of the lower magnetic stack of the MTJ structure are devoid of the tunnel barrier layer and the upper magnetic stack.

13 Claims, 12 Drawing Sheets

(56)        References Cited

U.S. PATENT DOCUMENTS

| 2016/0233333 | A1* | 8/2016 | Toh | H10N 50/01 |
| 2017/0069832 | A1* | 3/2017 | Kim | H10N 50/10 |
| 2018/0033957 | A1 | 2/2018 | Zhang et al. | |
| 2020/0251652 | A1* | 8/2020 | Hashemi | H10N 50/80 |
| 2022/0352457 | A1* | 11/2022 | Chuang | H10N 50/80 |

FOREIGN PATENT DOCUMENTS

| JP | 3854767 | B2 | 12/2006 |
| JP | 2008226919 | A | 9/2008 |
| JP | 2017028257 | A | 2/2017 |
| KR | 101015144 | B1 | 2/2011 |

* cited by examiner

MEMORY STRUCTURE WITH NON-ION BEAM ETCHED MTJ AND TOP ELECTRODE

BACKGROUND

The present application relates to semiconductor technology, and more particularly to a memory structure including a magnetic tunnel junction (MTJ) structure and a top electrode that are both formed without utilizing ion beam etching.

MRAM is a non-volatile random access memory technology in which data is stored by magnetic storage elements. These elements are typically formed from two ferromagnetic plates, each of which can hold a magnetization, separated by a thin dielectric layer (i.e., a tunnel barrier layer). One of the two plates (i.e., the magnetic reference or pinned layer) is a magnet whose magnetic moment direction is set to a particular direction; the other plate's (i.e., the magnetic free layer's) magnetization can be changed in at least two different directions, representing different digital states such as 0 and 1 for memory applications. In MRAMs, such elements may be referred to as a MTJ structure. In a typical MTJ structure, the magnetization of the magnetic reference layer is fixed in one direction (say pointing up), while the direction of the magnetic free layer can be "switched" by some external forces, such as a magnetic field or a spin-transfer torque generating charge current. A smaller current (of either polarity) can be used to read the resistance of the device, which depends on the relative orientations of the magnetizations of the magnetic free layer and the magnetic reference layer. The resistance is typically higher when the magnetizations are anti-parallel, and lower when they are parallel (though this can be reversed, depending on the material).

SUMMARY

A memory structure including a MTJ structure and a top electrode that are both formed without utilizing ion beam etching is provided. The MTJ structure, which includes a lower magnetic stack, a tunnel barrier layer and an upper magnetic stack, is pyramidal shaped, and end portions of the lower magnetic stack of the MTJ structure are devoid of the tunnel barrier layer and the upper magnetic stack. The top electrode, which has no corner erosion, has a seam present therein.

In one aspect of the present application, a memory structure is provided. In one embodiment of the present application, the memory structure includes a MTJ structure located on an electrically conductive structure, the MTJ structure includes a lower magnetic stack and an upper magnetic stack that are spaced apart by a tunnel barrier layer. The structure further includes a top electrode located on the upper magnetic stack of the MTJ structure, wherein the top electrode contains a seam. The MTJ structure and the top electrode are formed without utilizing ion beam etching. Thus no physical damage to the MTJ structure and the top electrode are observed.

In embodiments of the present application, the top electrode has a constant critical dimension throughout an entirety of the top electrode. This aspect of the present application signifies that no physical damage or corner erosion of the top electrode are present in the memory structure of the present application.

In embodiments of the present application, the electrically conductive structure is embedded in an interconnect dielectric material layer, and the electrically conductive structure and the interconnect dielectric material layer collectively form an interconnect level. This aspect of the present application signifies that the memory structure including the MTJ structure and the top electrode are formed in a back-end-of-the-line (BEOL) region of a structure.

In embodiments of the present application, the MTJ structure is pyramidal in shape. This shape helps to avoid shorting within the structure.

In embodiments of the present application, the lower magnetic stack of the MTJ structure has a first critical dimension, CD1, the tunnel barrier layer of the MTJ structure has a second critical dimension, CD2, and the upper magnetic stack of the MTJ structure has a third critical dimension, CD3, wherein CD1 is greater than CD2 and CD3, and CD2 is greater than, or equal to, CD3. This aspect of the present application also helps to avoid shorting in the structure.

In embodiments of the present application, the top electrode has a fourth critical dimension, CD4, wherein CD4 is less than CD1, and CD4 is equal to, or less than CD2 and CD3. This aspect of the present application also helps to avoid shorting in the structure.

In embodiments of the present application, the MTJ structure is a top pinned MTJ structure, and the lower magnetic stack includes a magnetic free layer, and the upper magnetic stack includes a magnetic reference layer.

In embodiments of the present application, the MTJ structure is a bottom pinned MTJ structure, and the lower magnetic stack includes a magnetic reference layer, and the upper magnetic stack includes a magnetic free layer.

In embodiments of the present application, the lower magnetic stack includes a bottom electrode, the bottom electrode is located in close proximity to the electrically conductive structure.

In embodiments of the present application, an upper sidewall portion of the top electrode is protected by a sacrificial dielectric material layer.

In embodiments of the present application, the sacrificial dielectric material layer has a residual magnetic stack located on a sidewall thereof.

In embodiments of the present application, an end portion of the lower magnetic stack is devoid of the tunnel barrier layer and the upper magnetic stack. This aspect of the present application also helps to mitigate the shorting in the structure.

In embodiments of the present application, the seam is present in a middle portion of the top electrode.

In embodiments of the present application, the seam extends outwards from the middle portion to sidewalls of the top electrode.

In another aspect of the present application, a method of forming a memory structure is provided. In one embodiment of the present application, the method includes forming an interconnect level including an electrically conductive structure embedded in an interlayer dielectric material layer, forming a bilayer dielectric material mask on the interconnect level, the bilayer dielectric material mask including a first dielectric material layer and a second dielectric material layer, and having an opening that physically exposes the electrically conductive structure; recessing the first dielectric material layer of the bilayer dielectric material mask to provide a recessed first dielectric material layer, wherein the second dielectric material layer overhangs the recessed first dielectric material layer; forming a MTJ structure on the electrically conductive structure, the MTJ structure including a lower magnetic stack and an upper magnetic stack that are spaced apart by a tunnel barrier layer, and forming a top electrode on the upper magnetic stack of the MTJ structure, wherein the top electrode contains a seam.

In embodiments of the present application, the method can further include forming a sacrificial dielectric material layer in the opening and along a sidewall of the second dielectric material layer and a sidewall of the recessed first dielectric material layer.

In embodiments of the present application, the forming of the MTJ structure includes a physical vapor deposition process, which may or may not be optimized to prevent deposition of the MTJ structure on the sidewalls of the recessed first dielectric material layer of the bilayer dielectric material mask.

In embodiments of the present application, the method can further include removing at least the second dielectric material layer and the recessed first dielectric material layer to reveal a sidewall of the top electrode.

In embodiments of the present application, the method can further include physically exposing end portions of the lower magnetic stack of the MTJ structure by removing the upper magnetic stack and the tunnel barrier layer therefrom.

In embodiments of the present application, the forming of the MTJ structure and the forming of the top electrode are both devoid of ion beam etching.

4

Figure 6A:
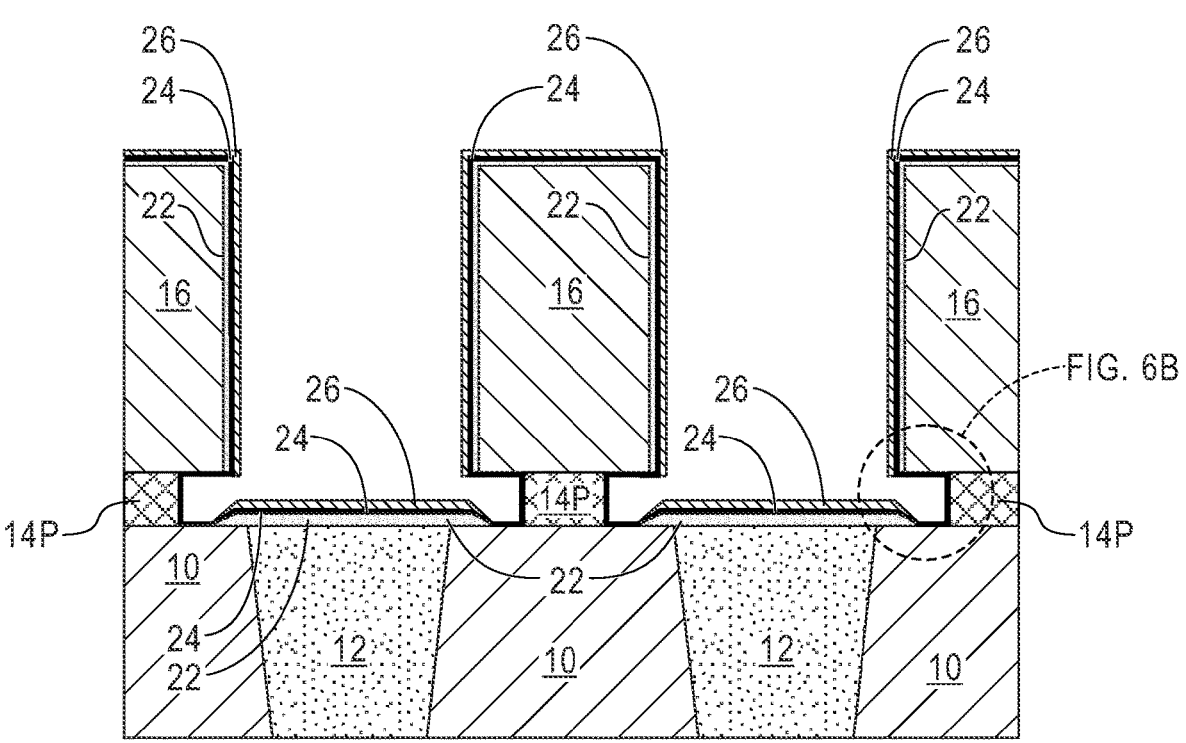
FIG. 6A is a cross sectional view of the exemplary structure shown in FIG. 4 after forming a MTJ structure in the at least one opening and on physically exposed surfaces of the second dielectric material layer of the bilayer dielectric material mask and the electrically conductive structure, wherein a tunnel barrier layer of the MTJ structure is formed along a physically exposed sidewall of the recessed first dielectric material layer.
Figure 6B:
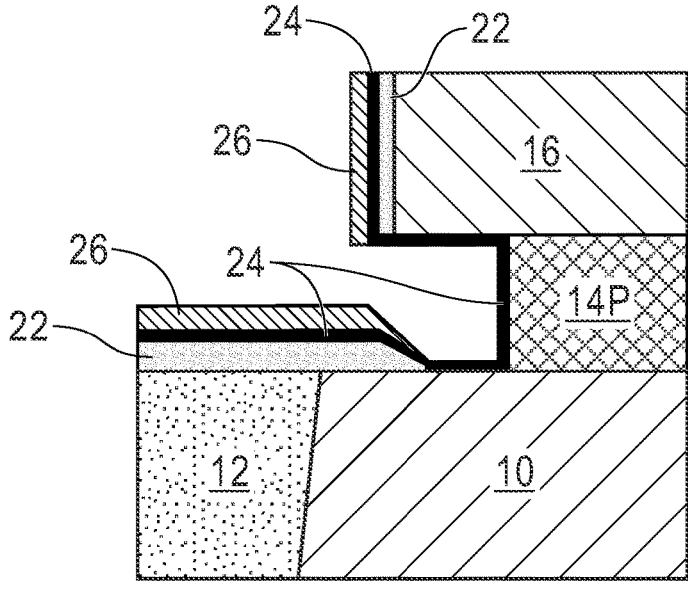

FIG. 6B is an enlarged cross sectional view of the area highlighted in FIG. 6A.

Figure 5A:
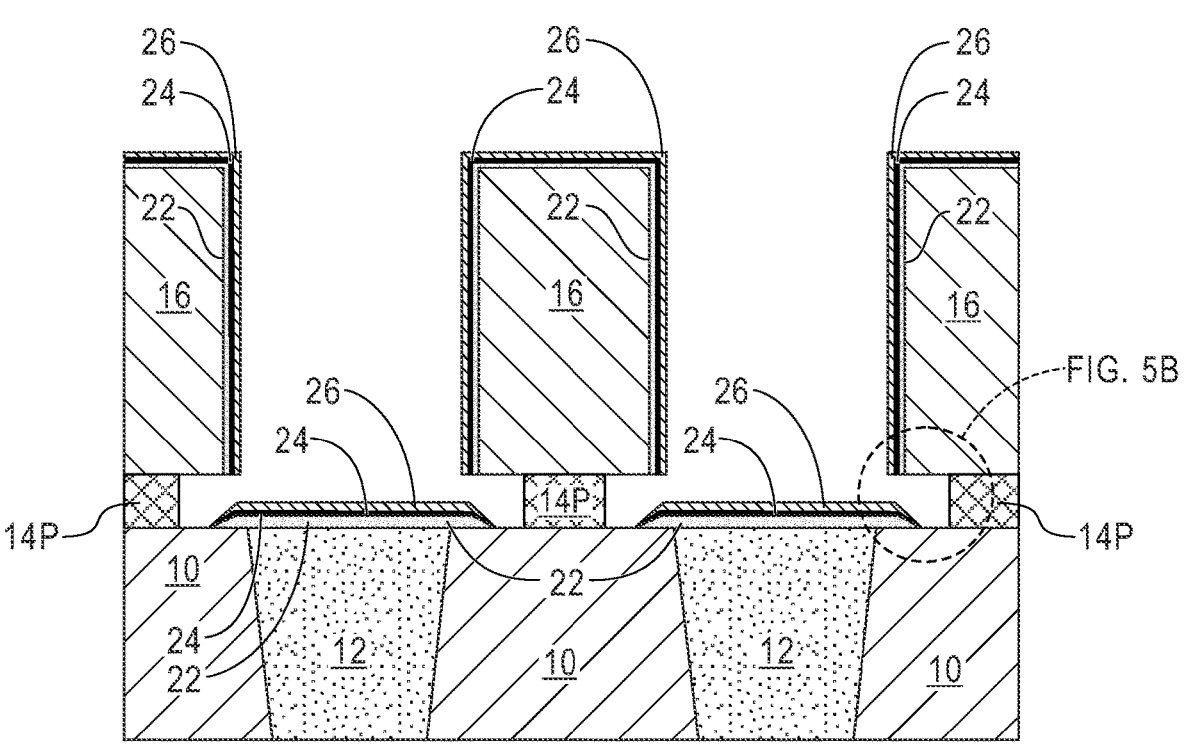
FIG. 5A is a cross sectional view of the exemplary structure shown in FIG. 4 after forming a MTJ structure in the at least one opening and on physically exposed surfaces of the second dielectric material layer of the bilayer dielectric material mask and the electrically conductive structure.
Figure 7:
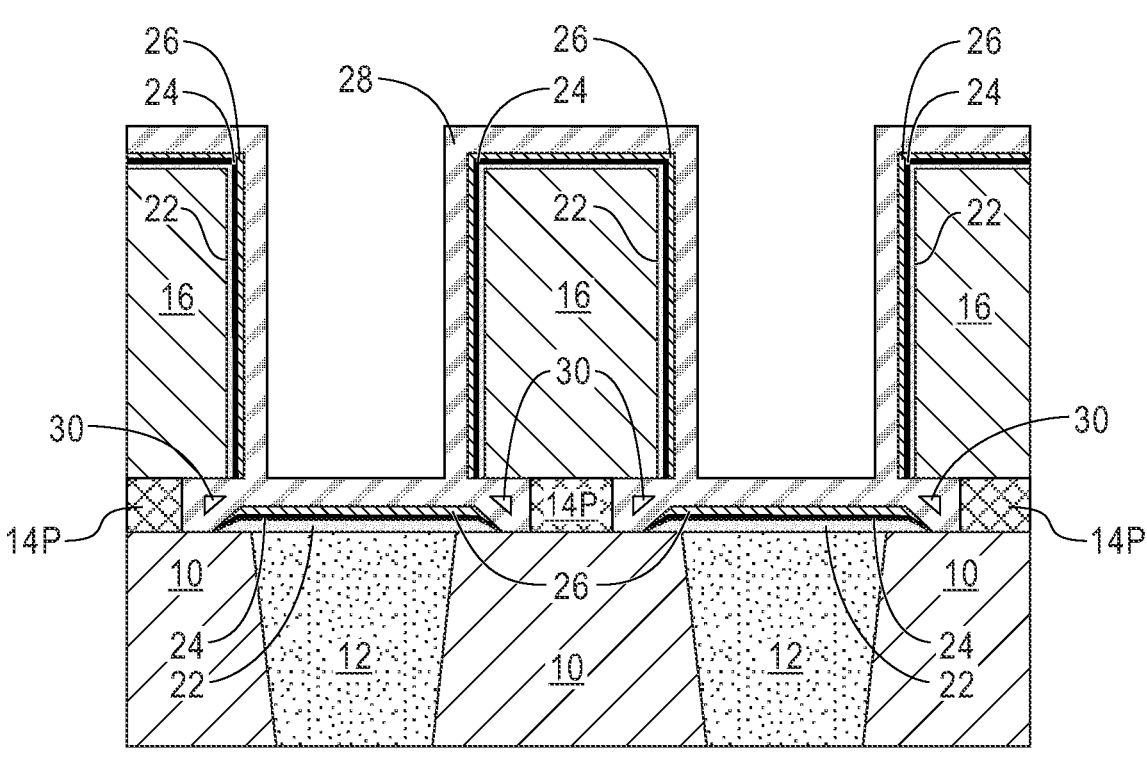

FIG. 7 is a cross sectional view of the exemplary structure shown in FIG. 5A after forming a sacrificial dielectric material layer.

Figure 8:
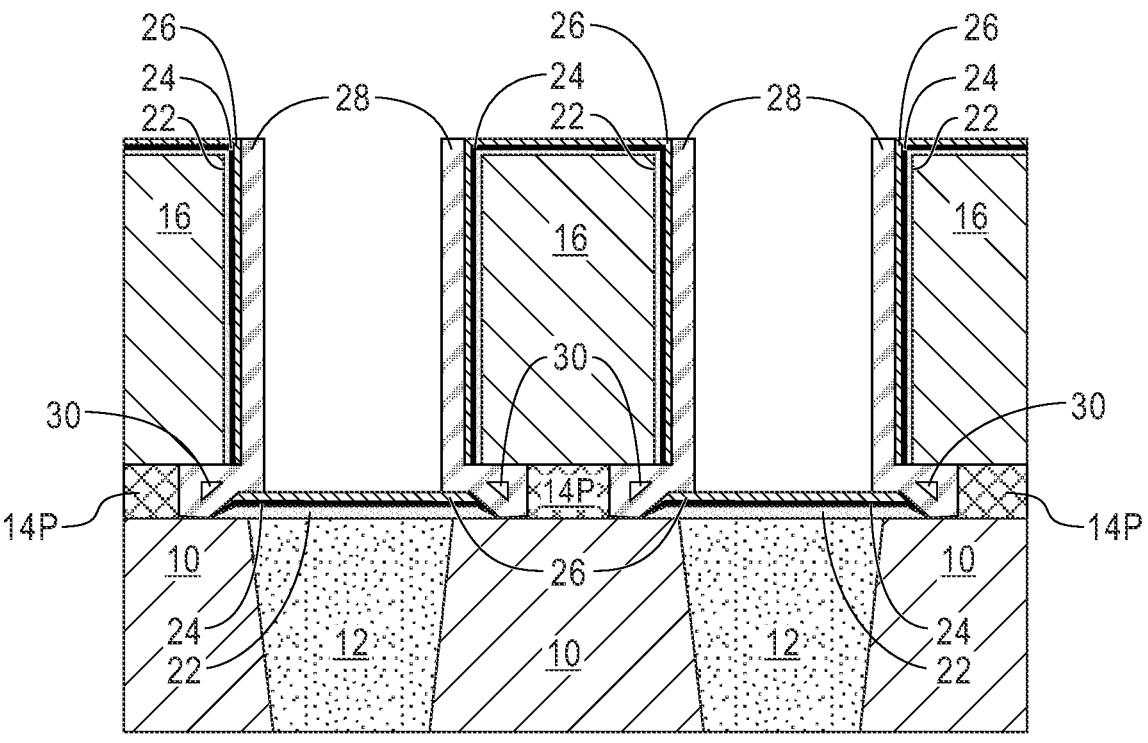

FIG. 8 is a cross sectional view of the exemplary structure shown in FIG. 7 after removing the sacrificial dielectric material layer from all horizontal surfaces of the MTJ structure including the topmost surface of the MTJ structure that is located on the bilayer dielectric material mask and a topmost surface of the MTJ structure that is located in the at least one opening.

Figure 9:
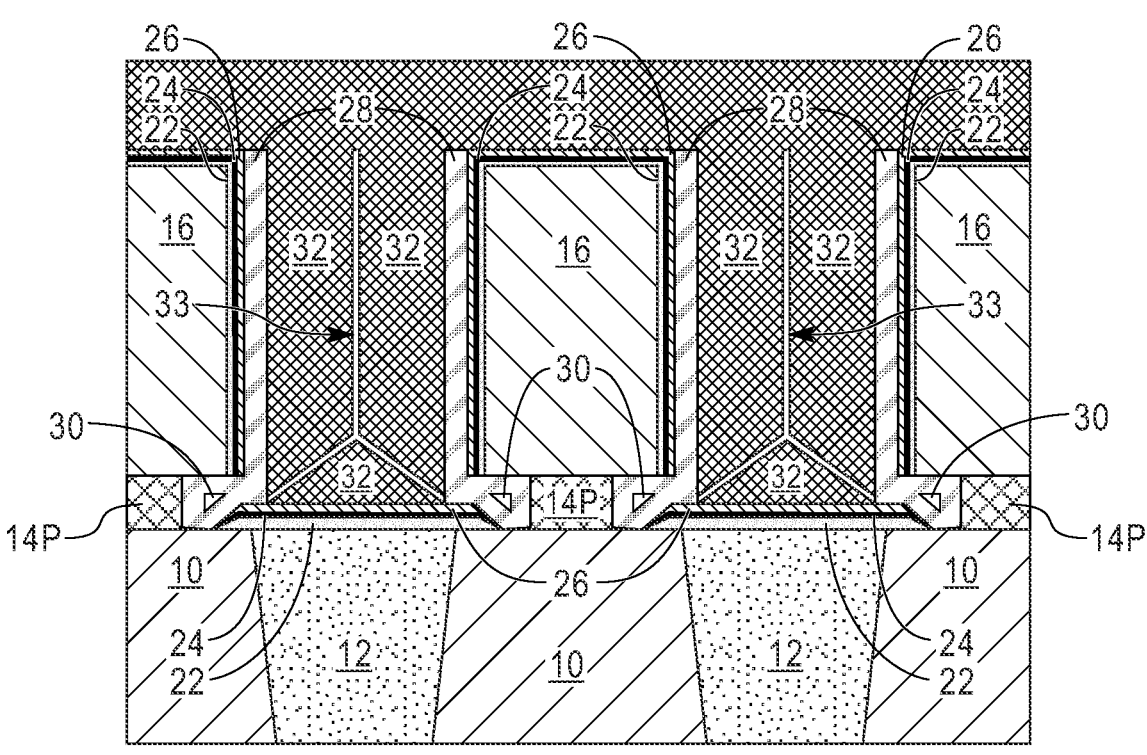

FIG. 9 is a cross sectional view of the exemplary structure shown in FIG. 8 after forming a top electrode, the top electrode having a seam.

Figure 10:
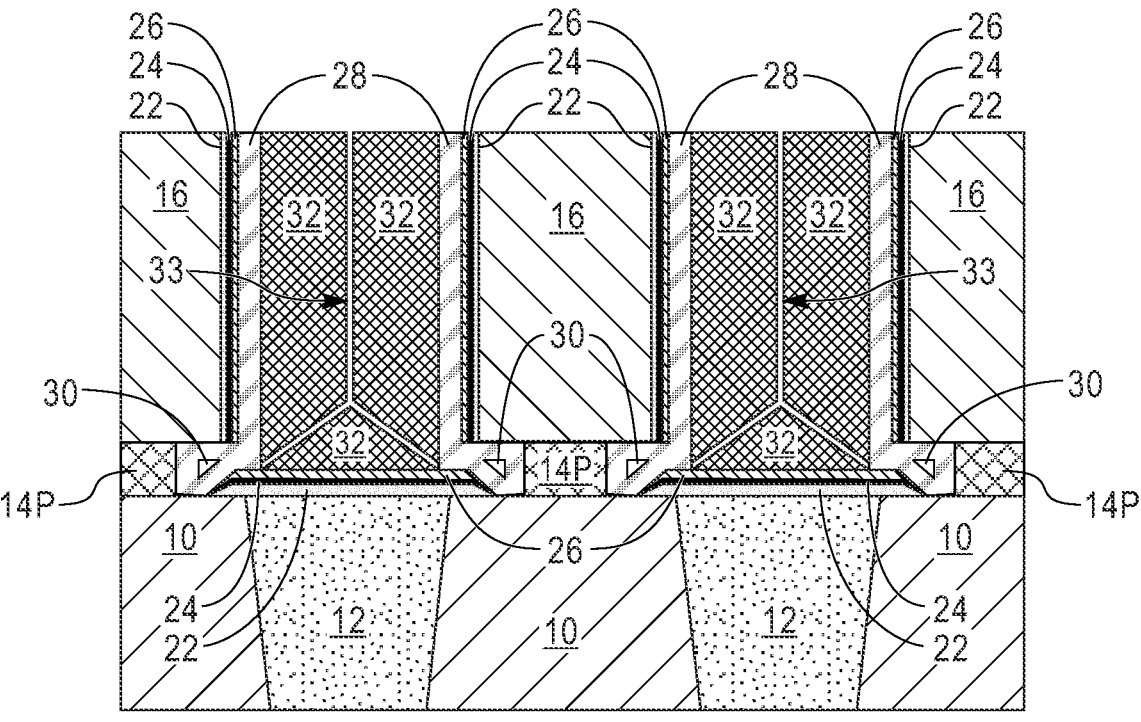

FIG. 10 is a cross sectional view of the exemplary structure shown in FIG. 9 after removing the top electrode from above the bilayer dielectric material mask, wherein during the removal of the top electrode, the MTJ structure that is present on the bilayer dielectric material mask is also removed.

Figure 11:
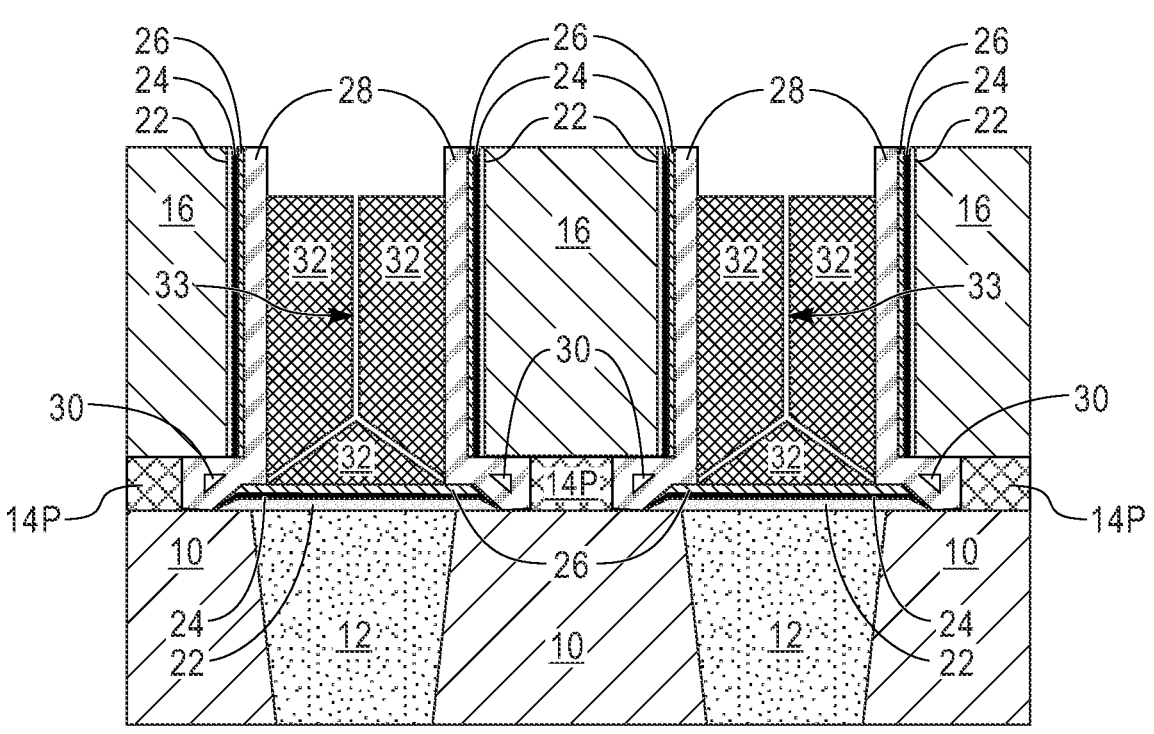

FIG. 11 is a cross sectional view of the exemplary structure shown in FIG. 10 after recessing the top electrode that is present in the at least one opening.

Figure 12:
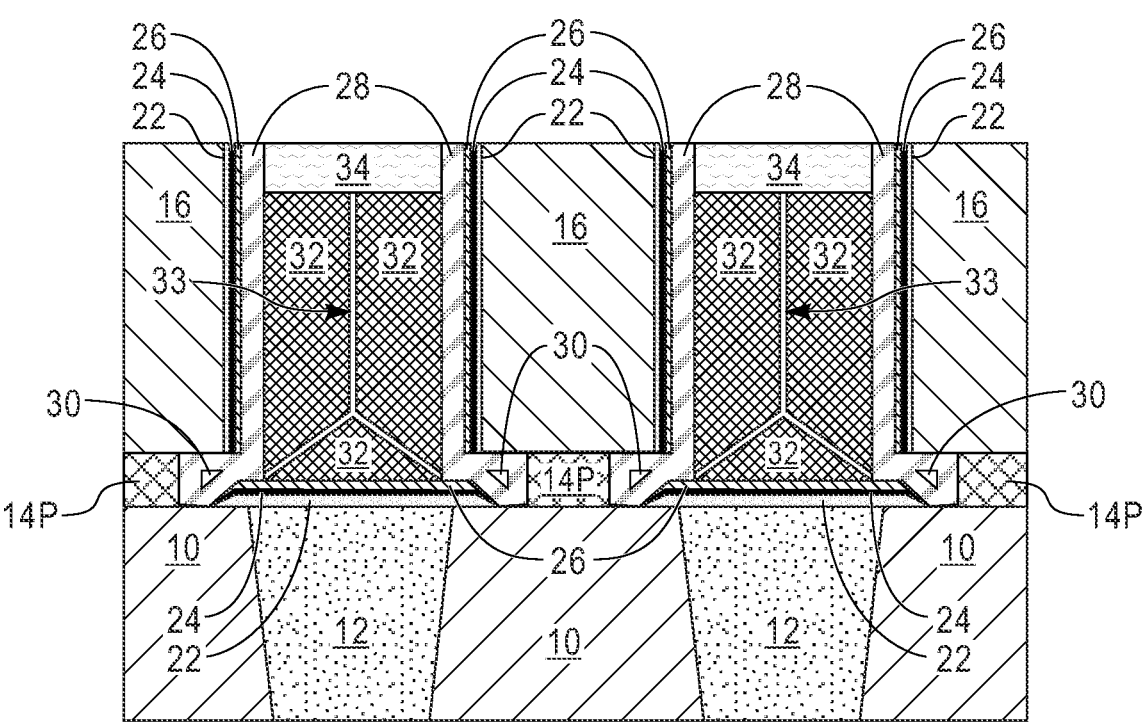

FIG. 12 is a cross sectional view of the exemplary structure shown in FIG. 11 after forming a dielectric cap on the recessed top electrode.

Figure 13:
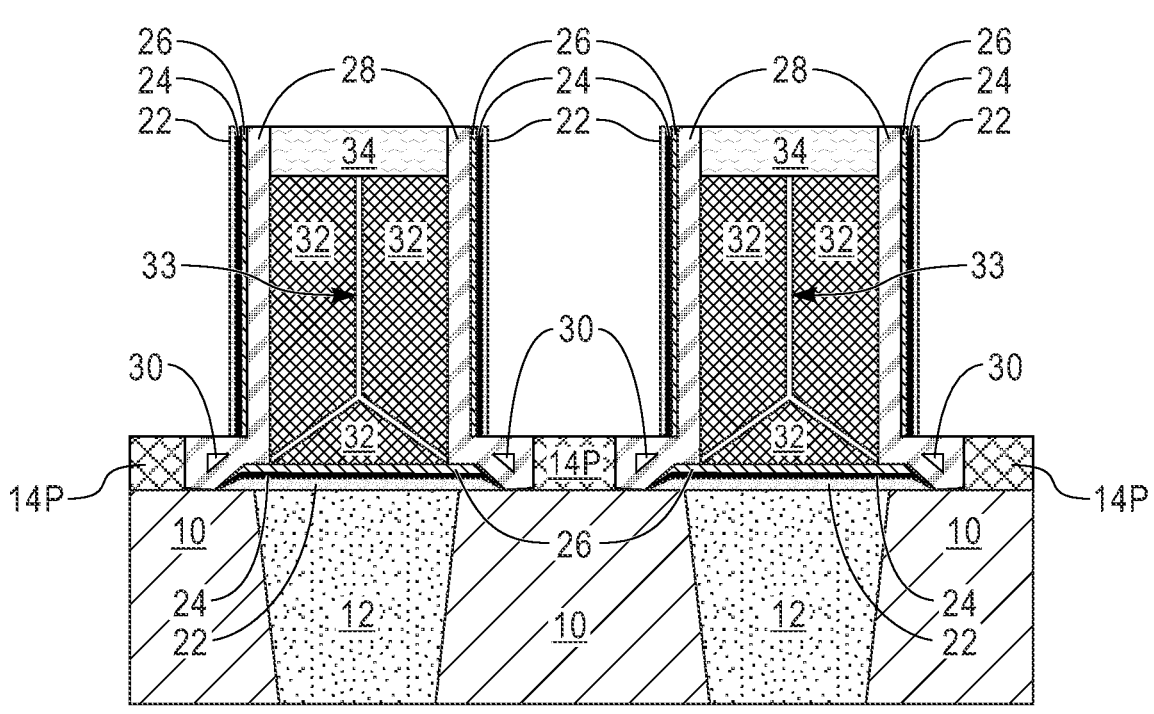

FIG. 13 is a cross sectional view of the exemplary structure shown in FIG. 12 after removing the second dielectric material layer of the bilayer dielectric material mask.

Figure 14:
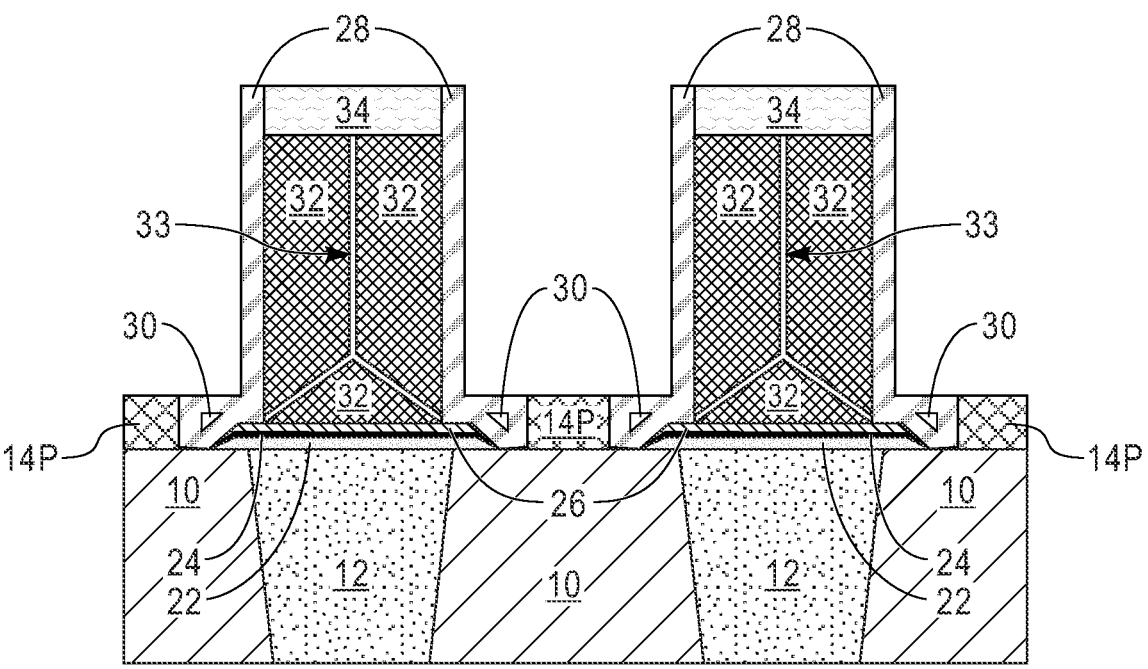

FIG. 14 is a cross sectional view of the exemplary structure shown in FIG. 13 after removing the MTJ structure from a sidewall of the sacrificial dielectric material layer.

Figure 15:
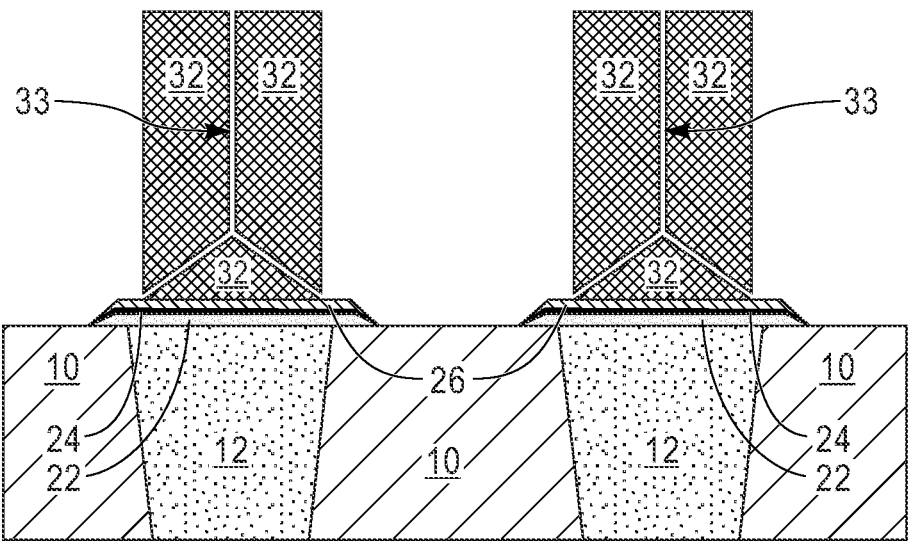

FIG. 15 is a cross sectional view of the exemplary structure shown in FIG. 14 after removing the dielectric cap, the sacrificial dielectric material layer and the recessed first dielectric material layer of the bilayer dielectric material mask.

Figure 16:
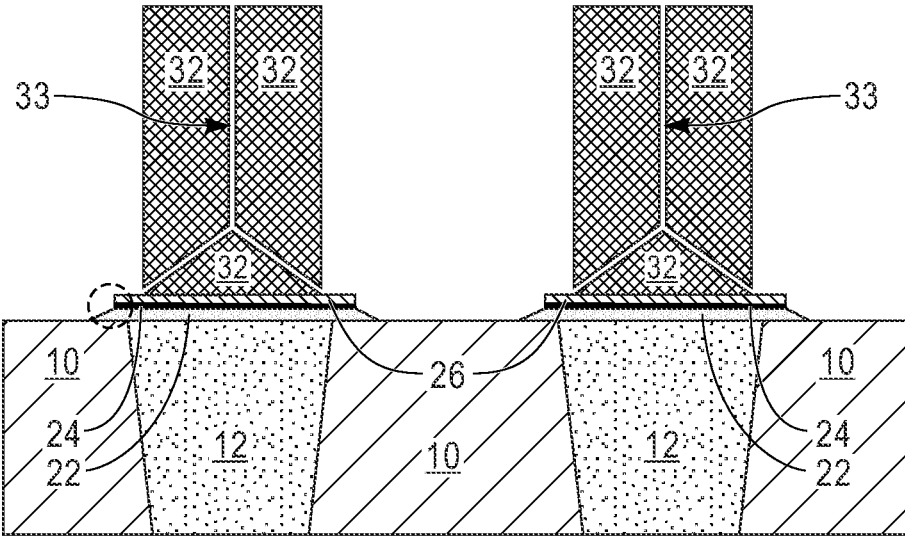

FIG. 16 is a cross sectional view of the exemplary structure shown in FIG. 15 after removing the upper magnetic layer stack and the tunnel barrier layer of the MTJ structure to physically expose an end portion of a lower magnetic stack of the MTJ structure.

Figure 17:
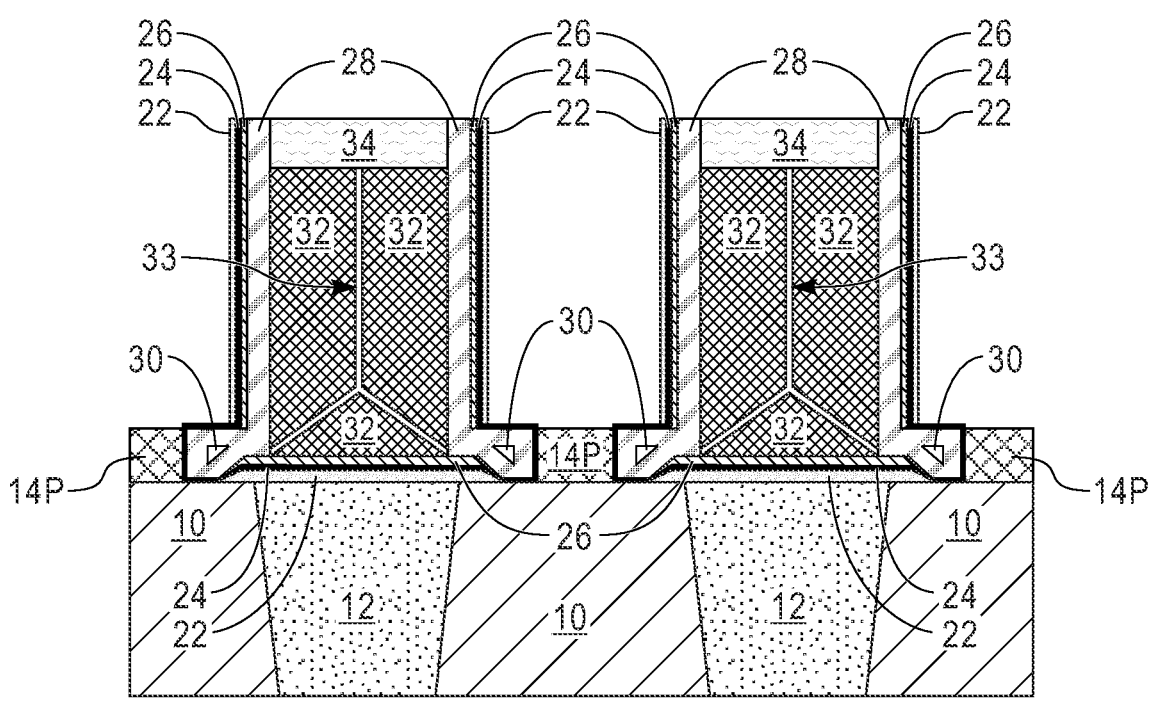

FIG. 17 is a cross sectional view of the exemplary structure shown in FIG. 6A after performing the processing steps mentioned above in FIGS. 8-12, and then removing the second dielectric material layer of the bilayer dielectric material mask.

Figure 18:
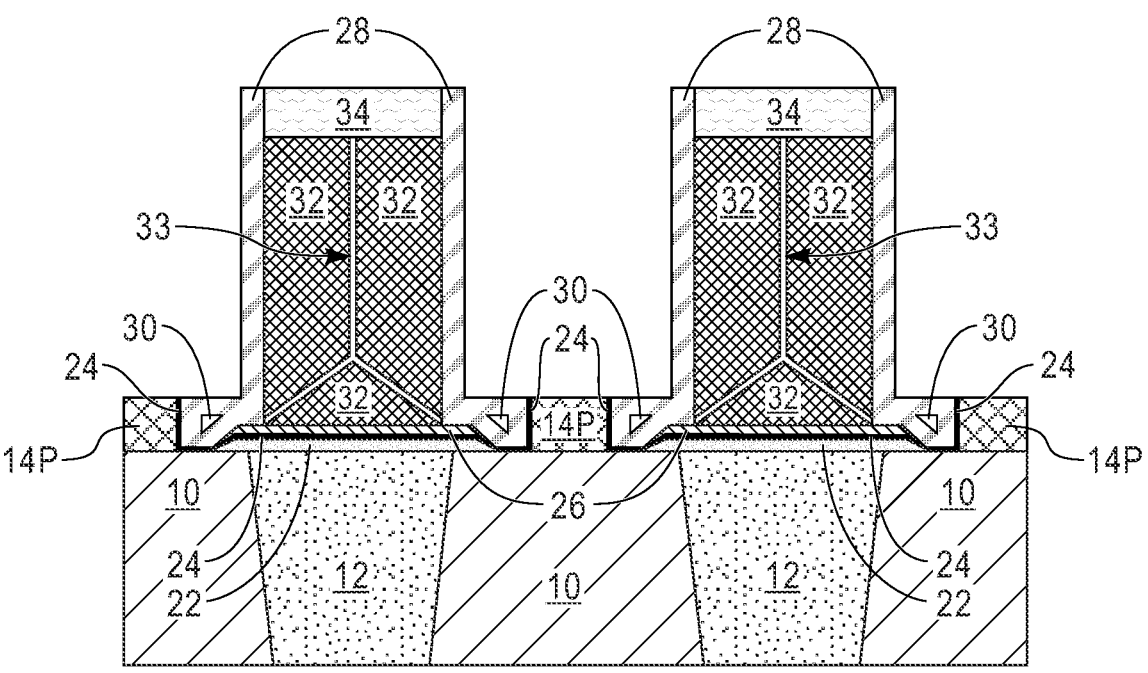

FIG. 18 is a cross sectional view of the exemplary structure shown in FIG. 17 after removing the MTJ structure from a sidewall of the sacrificial dielectric material layer.

Figure 19:
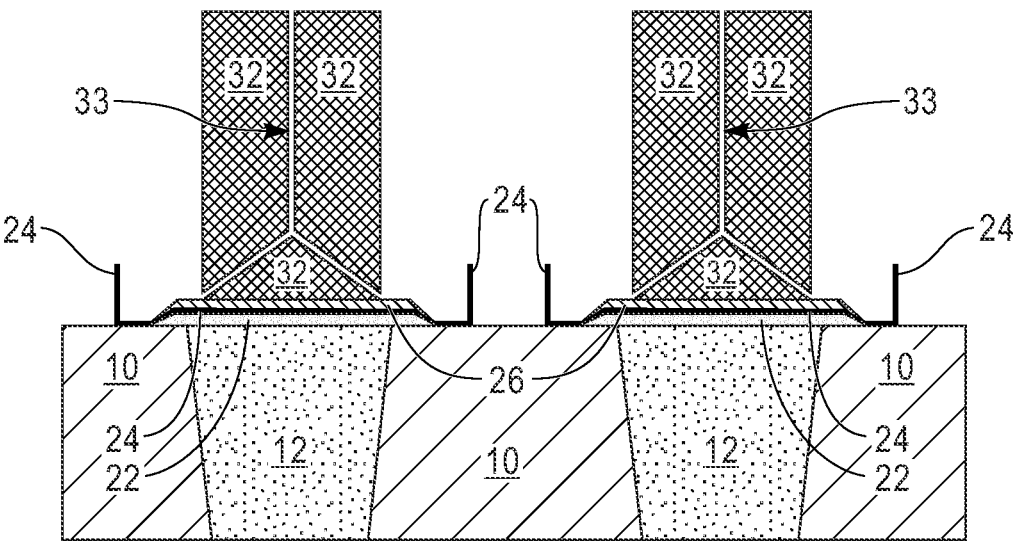

FIG. 19 is a cross sectional view of the exemplary structure shown in FIG. 18 after removing the dielectric cap, the sacrificial dielectric material layer and the recessed first dielectric material layer of the bilayer dielectric material mask.

Figure 20:
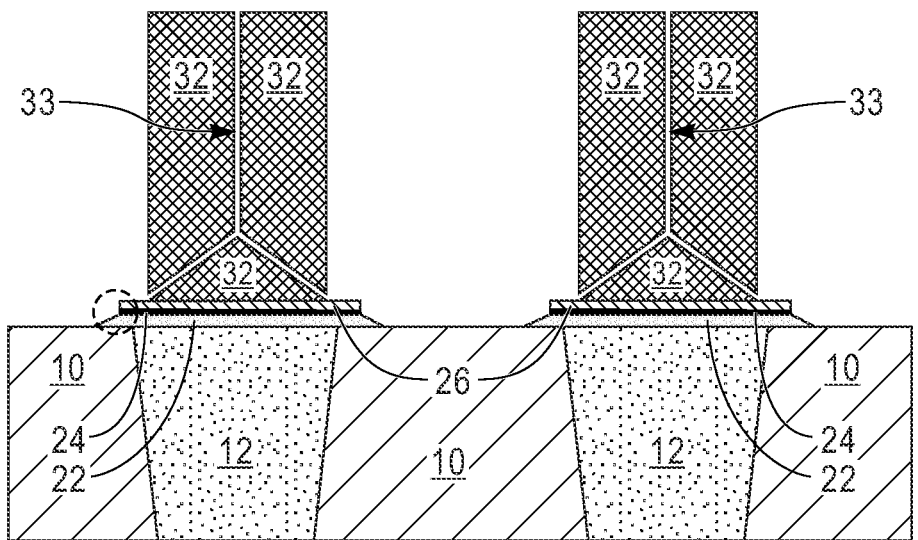

FIG. 20 is a cross sectional view of the exemplary structure shown in FIG. 19 after removing the upper magnetic layer stack and the tunnel barrier layer of the MTJ structure to physically expose an end portion of a lower magnetic stack of the MTJ structure.

Figure 21:
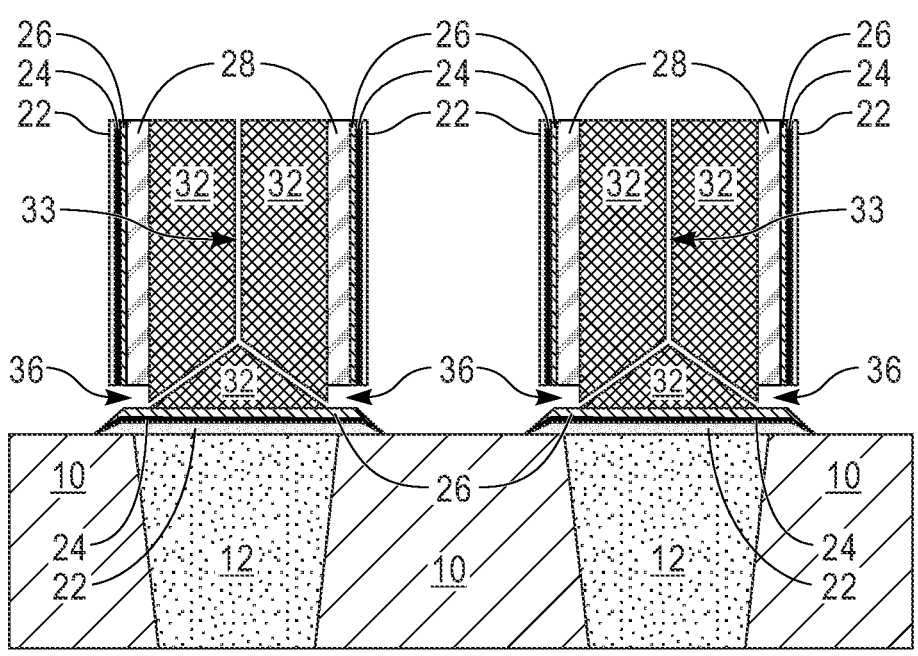

FIG. 21 is a cross sectional view of the exemplary structure shown in FIG. 10 after removing the bilayer dielectric material mask, the dielectric cap, and a physically exposed portion of the sacrificial dielectric material layer.

Figure 22:
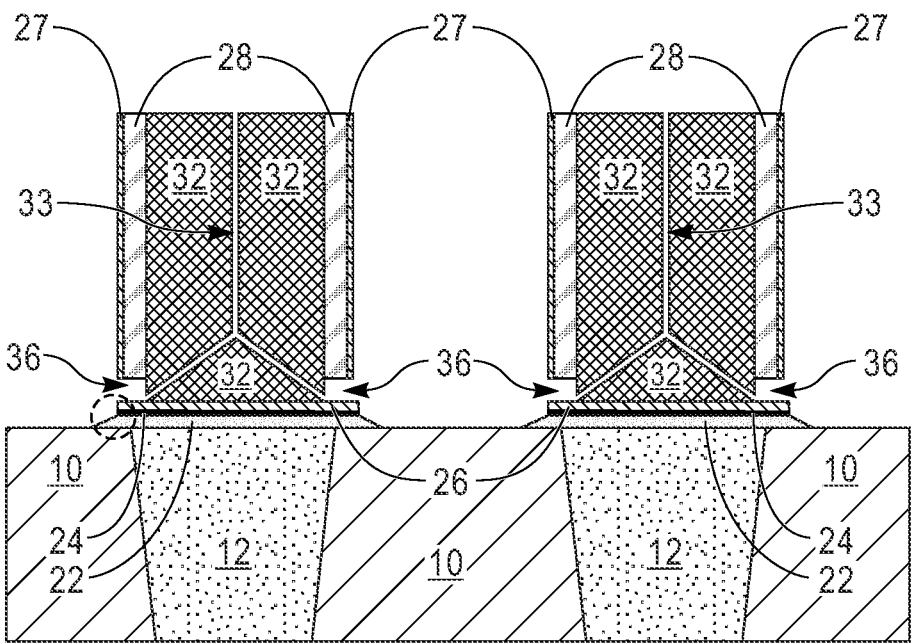

FIG. 22 is a cross sectional view of the exemplary structure shown in FIG. 21 after removing the upper magnetic layer stack and the tunnel barrier layer of the MTJ structure to physically expose an end portion of a lower magnetic stack of the MTJ structure.

DETAILED DESCRIPTION

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

MRAM is one of the promising non-volatile memories for analog computing application and it can be used as L2 cache replacing static random access memory (SRAM). Ion beam etching is a go-to MTJ structure patterning process that is implemented in the prior art due to its tilted etching capability which is needed to get ride of metallic veil across the tunnel barrier layer of the MTJ structure without causing chemical damage to the MTJ structure. The top electrode which is employed as a hard mask should not cause shadowing during the titled ion beam etching process. Taller top electrodes require a certain distance between memory cells, which can affect memory density. Short top electrode height can help reduce cell-to-cell distance but short top electrodes increase shorting risk by reducing the over-etching margin of the top electrode contact. Even without using a titled ion beam etching process, there exist a shorting risk across the tunnel barrier layer.

Another concern with current MTJ patterning processes is that the MTJ structure including the top electrode is optically opaque, which limits alignment accuracy between the MTJ cell and an electrically conductive structure that is located beneath the MTJ structure.

The present application provides a method to increase cell density without lowering the top electrode height and with good alignment between the MTJ cell to the electrically conductive structure. In embodiments of the present application, a MTJ structure is provided without using ion beam etching. In embodiments of the present application, the top electrode of the MTJ structure is also provided without utilizing ion beam etching and the top electrode has a seam, and no corner erosion of the top electrode is observed.

Figure 1:
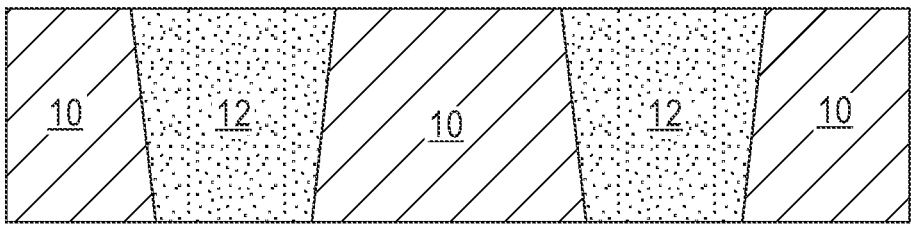
FIG. 1 is a cross sectional view on an exemplary structure that can be employed in accordance with an embodiment of the present application, the exemplary structure including an interconnect level including at least one electrically conductive structure embedded in an interconnect dielectric material layer.

Referring first to FIG. 1, there is illustrated an exemplary structure that can be employed in accordance with an embodiment of the present application. The exemplary structure includes an interconnect level including at least one electrically conductive structure 12 (two electrically conductive structures 12 are shown by way of one example in the drawings of the present application) embedded in an interconnect dielectric material layer 10. This interconnect level is located in the BEOL.

The interconnect level illustrated in FIG. 1 can be located above at least one underlying metal level (not shown) and a front-end-of-the-level (FEOL) also not shown. In some embodiments, the metal level can be a middle-of-the line (MOL) level. In other embodiments, the metal level can be at least one lower interconnect level of a multi-level interconnect structure. In yet further embodiments, the metal level can be a combination of a MOL level and at least one lower interconnect level of a multi-level interconnect structure. The metal level can include bottom electrically conductive structures embedded in a dielectric material layer. The FEOL can include a semiconductor substrate having one or more semiconductor devices (such as, for example, transistors) formed thereon. The metal level and the FEOL can be formed utilizing materials and techniques that are well known to those skilled in the art. So not to obscure the memory structure of the present application, the materials and techniques used in providing the metal level and the FEOL are not described in the present application.

The interconnect dielectric material layer 10 can be composed of any interconnect dielectric material including, for example, silicon oxide (SiOx), silsesquioxanes, C doped oxides (i.e., organosilicates) that includes atoms of Si, C. O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like. The interconnect dielectric material layer 10 can have a dielectric constant (all dielectric constants mentioned herein are measured relative to a vacuum, unless otherwise stated) that is about 4.0 or less. In one embodiment, the interconnect dielectric material layer 10 has a dielectric constant of 2.8 or less. These dielectrics generally having a lower parasitic cross talk as compared to dielectric materials whose dielectric constant is greater than 4.0. The interconnect dielectric material layer 10 can be formed by a deposition process such as, for example, chemical vapor deposition (CVD), plasma enhanced chemical vapor deposition (PECVD) or spin-on coating. The interconnect dielectric material layer 10 can have a thickness from 50 nm to 250 nm. Other thicknesses that are lesser than 50 nm, and greater than 250 nm can also be employed in the present application as the thickness of the interconnect dielectric material layer 10.

The at least one electrically conductive structure 12 can be composed of an electrically conductive metal or electrically conductive metal alloy. Illustrative examples of electrically conductive materials that can be used in the present application to provide that at least one electrically conductive structure 12 include, but are not limited to, Cu, Al, Cu—Al alloy, W, Ru, or Rh; note that in this application chemical symbols from the Periodic Table of Elements are typically used to describe the various chemical elements and/or compounds and/or alloys that can be employed. The at least one electrically conductive structure 12 typically is cylindrical in shape. The shape of the at least one electrically conductive structure 12 is however not limited to cylindrical and other shapes can be used for the shape of the at least one electrically conductive structure 12.

In some embodiments, a diffusion barrier liner (not shown) can be present along at least a sidewall (and in some embodiments along a bottom wall) of the at least one electrically conductive structure 12. When present, the diffusion barrier liner can be composed of any well-known diffusion barrier material such as, for example, Ta, TaN, Ti, TiN, W or WN. In some embodiments, the diffusion barrier liner can include a material stack of two or more diffusion barrier materials. In one example, the diffusion barrier liner can be composed of a stack of Ta/TaN or a stack of Ti/TiN.

The exemplary structure shown in FIG. 1 can be formed by first depositing the interconnect dielectric material layer 10. Next, at least one opening is formed into the interconnect dielectric material layer 10 by lithography and etching. Lithography includes forming a photoresist material on a surface of a material layer or a stack of material layers that need(s) to be patterned, exposing the deposited photoresist material to a pattern of irradiation and thereafter developing the exposed photoresist material. The etching used in providing the at least one opening into the interconnect dielectric material layer 10 can include a dry etching process (i.e., reactive ion etching, plasma etching or ion beam etching) or a chemical wet etch. Next, and if present, a layer of diffusion barrier material can be formed in the at least opening and on top of the interconnect dielectric material layer 10. The forming of the layer of diffusion barrier material includes a deposition process such as, for example, CVD, PECVD, physical vapor deposition (PVD) or atomic layer deposition (ALD). The layer of diffusion barrier material does not fill in an entirety of the at least one opening. Next, one of the above mentioned electrically conductive materials (e.g., Cu) is then deposited on the layer of diffusion barrier material. The deposition of the electrically conductive material can include CVD, PECVD, PVD, ALD, sputtering or plating. A planarization process such as, for example, chemical mechanical polishing (CMP), is then performed to remove the layer of diffusion barrier material (if the same is present) and the electrically conductive material that is formed outside of the at least one opening and on top of the interconnect dielectric material layer 10. The electrically conductive material and, if present, the layer of diffusion barrier material remain in the opening after the planarization process. The electrically conductive material that remains in the opening provides electrically conductive structure 12 and, if present, the diffusion barrier material layer that remains in the opening provides the diffusion barrier liner (not shown in FIG. 1). In embodiments of the present application, the at least one electrically conductive structure 12 has a topmost surface that is coplanar with at least a topmost surface of the interconnect dielectric material layer 10; if a diffusion barrier liner is present, the topmost surface of the at least one electrically conductive structure 12 can also be coplanar with a topmost surface of the diffusion barrier layer as well as with a topmost surface of the interconnect dielectric material layer 10.

Figure 2:
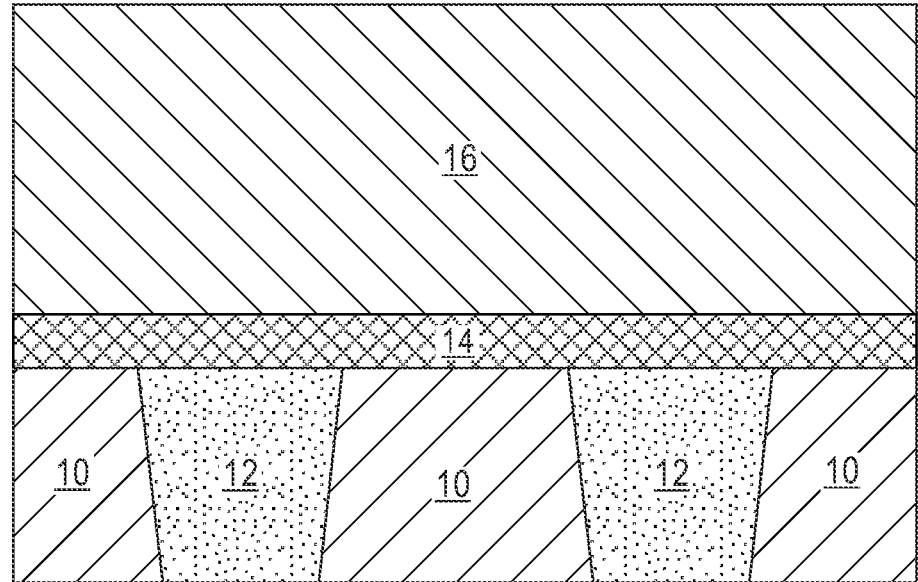
FIG. 2 is a cross sectional view of the exemplary structure shown in FIG. 1 after forming a bilayer dielectric material stack of a first dielectric material layer and a second dielectric material layer on the interconnect level.

Referring now to FIG. 2, there is illustrated the exemplary structure shown in FIG. 1 after forming a bilayer dielectric material stack of a first dielectric material layer 14 and a second dielectric material layer 16 on the interconnect level. Notably, the bilayer dielectric material stack is formed on physically exposed surfaces of both the interconnect dielectric material layer 10 and the at least one electrically conductive structure 12. The bilayer dielectric material stack employed in the present application is composed of optically transparent dielectric materials, as defined herein below, and thus during a subsequently patterning process an opening can be formed into the bilayer dielectric material stack that has good alignment to the electrically conductive structure 12.

The first dielectric material layer 14 of the bilayer dielectric material stack is composed of a first optically transparent dielectric material, while the second dielectric material layer 16 is composed of a second optically transparent dielectric material that is compositionally different from the first optically transparent dielectric material. The optically transparent dielectric materials are typically dielectric hard mask materials such as, for example, silicon dioxide, silicon nitride or silicon oxynitride. In one example, the first optically transparent dielectric material that provides the first dielectric material layer 14 can be composed of silicon dioxide, while the second hard mask material that provides the second dielectric material layer 16 is composed of silicon nitride. In the present application, at least the first dielectric material layer 14 of the bilayer dielectric material stack is compositionally different from the upper portion of the first interlayer dielectric material layer 10.

The first dielectric material layer 14 has a first thickness, and the second dielectric material layer 16 has a second thickness that is greater than the first thickness. The first thickness of the first dielectric material layer 14 is designed to be slightly thicker (about 10%) than the thickness of the MTJ structure. In one example, the first thickness is from 10 nm to 200 nm, while the second thickness is from 60 nm to 100 nm.

The bilayer dielectric material stack can be formed utilizing a deposition process such as, for example, CVD, PECVD, PVD, or ALD. Notably, a first deposition process can be used in forming the first dielectric material layer 14 and a second deposition process can be used in providing the second dielectric material layer 16. The first and second deposition processes can be the same deposition process (e.g., CVD), or different deposition processes (e.g., CVD, followed by PVD) can be used in providing the bilayer dielectric material stack.

Figure 3:
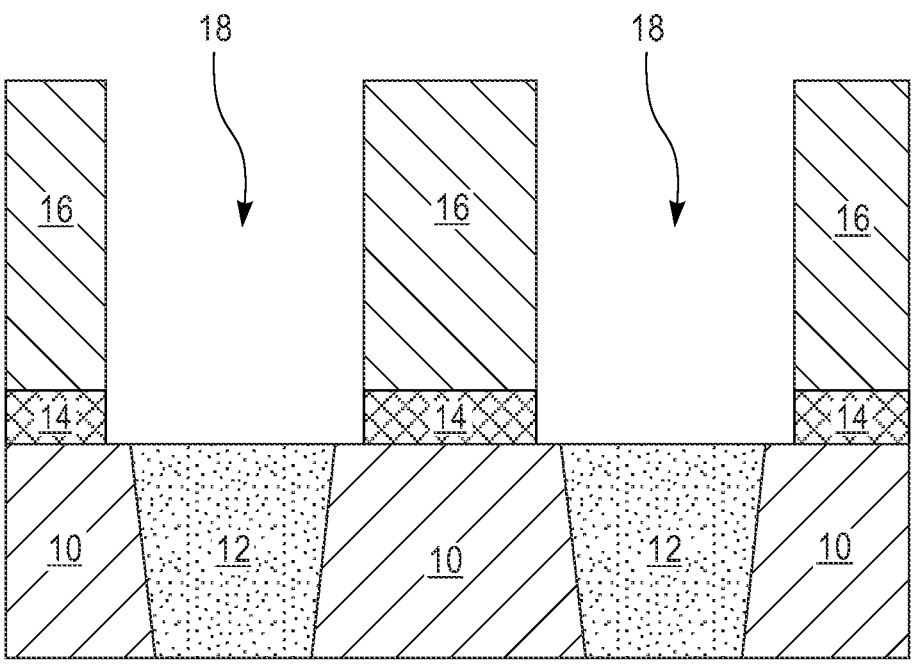
FIG. 3 is a cross sectional view of the exemplary structure shown in FIG. 2 after patterning the bilayer dielectric material stack to provide a bilayer dielectric material mask having at least one opening formed therein, the at least one opening physically exposes a surface of the at least one electrically conductive structure.

Referring now to FIG. 3, there is illustrated the exemplary structure shown in FIG. 2 after patterning the bilayer dielectric material stack to provide a bilayer dielectric material mask having at least one opening 18 formed therein, the at least one opening 18 physically exposes a surface of the at least one electrically conductive structure 12. The at least opening 18 has good alignment to the underlying electrically conductive structure 12. By "good alignment" it is meant that the opening 18 physically exposes an entirety of the electrically conductive structure 12 with little, or no portion of the interconnect dielectric material layer 10 being exposed.

The opening 18 can be formed by lithography and etching, as defined above. The bilayer dielectric material mask is composed of remaining (i.e., non-etched) portions of the first and second dielectric material layers of the bilayer dielectric material stack mentioned above. At this point of the present application, each unetched portion of the second dielectric material layer 16 of the bilayer dielectric material mask has a physically exposed sidewall in the opening 18 that is vertically aligned with a physically exposed sidewall of an underlying unetched portion of the first dielectric material layer 14.

Figure 4:
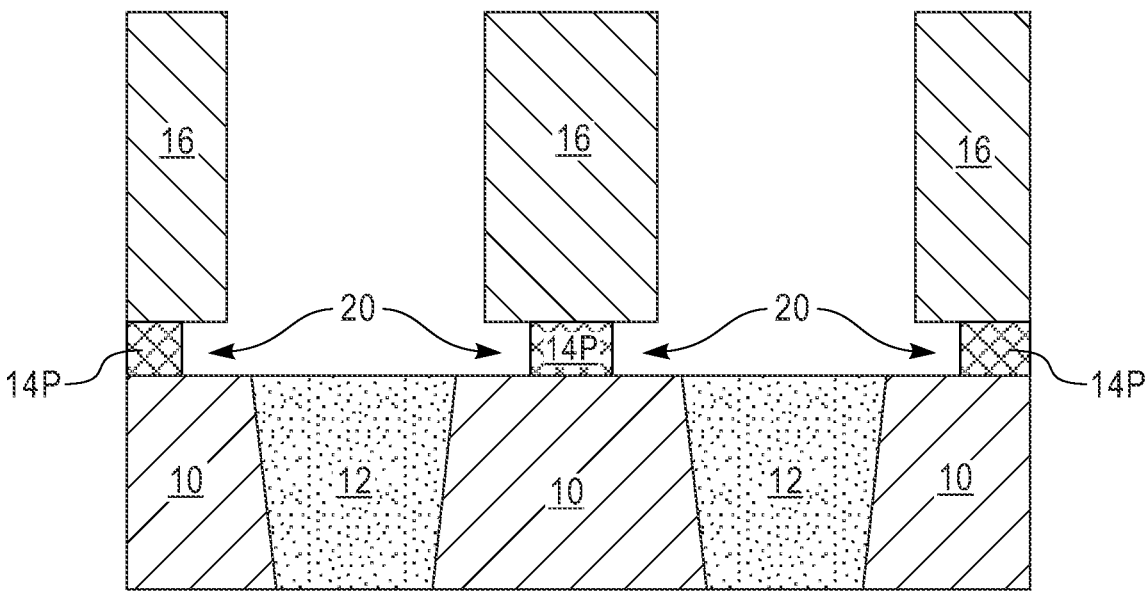
FIG. 4 is a cross sectional view of the exemplary structure shown in FIG. 3 after performing a selective etching process that recesses the first dielectric material layer that is present in the bilayer dielectric material mask, wherein the second dielectric material layer of the bilayer dielectric material mask overhangs the recessed first dielectric material layer of the bilayer dielectric material mask.

Referring now to FIG. 4, there is illustrated the exemplary structure shown in FIG. 3 after performing a selective etching process that recesses the first dielectric material layer 14 that is present in the bilayer dielectric material mask, wherein the second dielectric material layer 16 of the bilayer dielectric material mask overhangs the recessed first dielectric material layer 14P of the bilayer dielectric material mask. The selective etching process is a lateral chemical etch that is selective in removing a portion of the first dielectric material layer 14. In one example, and when the first dielectric material layer 14 is composed of silicon dioxide, the lateral chemical etch can include diluted hydrofluoric (DHF) acid and HF vapor. The recessed first dielectric material layer 14P has a sidewall in the opening 18 that is indented relative to a sidewall of the unetched portion of the second dielectric material layer 16 of the bilayer dielectric material mask. Gap 20 is now present beneath the portion of the unetched second dielectric material layer 16 of the bilayer dielectric material mask that overhangs the recessed first dielectric material layer 14P. Gap 20 has a lateral width that is equal to the amount of first dielectric material layer 14 that is removed by this selective etching process. In embodiments of the present application, this selective etching process removes from 5 nm to 30 nm of the first dielectric material layer 14.

Figure 5B:
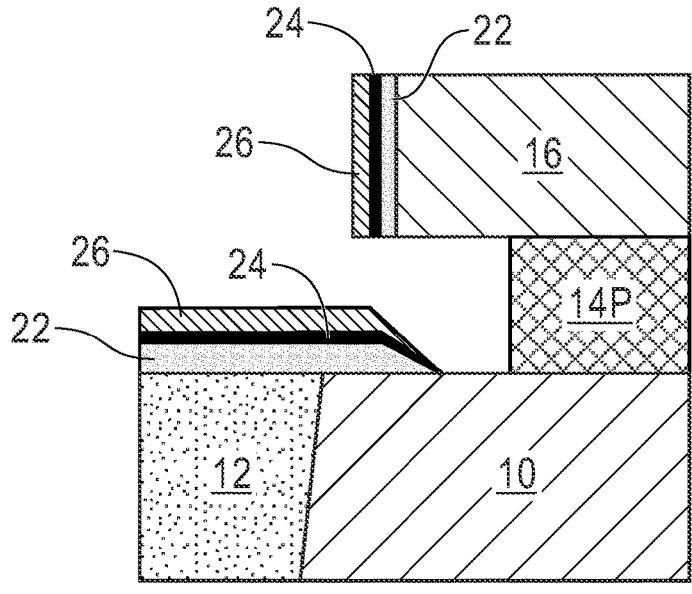
FIG. 5B is an enlarged cross sectional view of the area highlighted in FIG. 5A.

Referring now to FIGS. 5A-5B, there are shown the exemplary structure shown in FIG. 4 after forming a MTJ structure in the at least one opening 18 and on physically exposed surfaces of the second dielectric material layer 16 of the bilayer dielectric material mask and the electrically conductive structure 12. The exemplary structure shown in FIGS. 5A-5B represents one embodiment of the present application in which no portion of the MTJ structure is formed on a physically exposed sidewall of the recessed first dielectric material layer 14P. In some embodiments, and as is illustrated in FIGS. 6A-6B, a portion of the MTJ structure can form along the physically exposed sidewall of the recessed first dielectric material layer 14P.

The MTJ structure that is formed includes a lower magnetic stack 22, a tunnel barrier layer 24, and an upper magnetic stack 26. The tunnel barrier layer 24 separates the lower magnetic stack 22 from the upper magnetic stack 26. The lower magnetic stack 22 includes at least a bottom electrode (not shown) that is formed in close proximity to the electrically conductive structure 12. By "close proximity" it is meant that the bottom electrode is located either directly on the electrically conductive structure 12 or it is spaced apart from the electrically conductive structure 12 by a distance from 1 nm to 10 nm. In one embodiment of the present application, the lower magnetic stack 22 can include a magnetic free layer, while the upper magnetic stack 26 can include a magnetic pinned layer. In another embodiment of the present application, the lower magnetic stack 22 can include a magnetic pinned layer, while the upper magnetic stack 26 can include a magnetic free layer. Other magnetic and non-magnetic layers that are well known to those skilled in the art can be present in both the lower magnetic stack 22 and the upper magnetic stack. For example, the lower magnetic stack 22 can further include a metal seed layer, a metal buffer layer, and/or a metal spacer, and the upper magnetic stack 26 can further include a metal spacer, and/or a metal cap.

The bottom electrode is composed of an electrically conductive material such as, for example, Ta, TaN, Ti, TiN, Ru, RuN, RuTa, RuTaN, Co, CoWP, CON, W. WN or any combination thereof. The bottom electrode can have a thickness from 10 nm to 100 nm; although other thicknesses are contemplated and can be used in the present application as the thickness of the bottom electrode.

The magnetic free layer is composed of at least one magnetic material with a magnetization that can be changed in orientation relative to the magnetization orientation of a magnetic reference layer; note that the term "magnetic free layer" denotes that this magnetic layer has magnetization that can change (i.e., it does not have a fixed magnetization); the term does not however mean that this layer does not contain a magnetic material. Exemplary materials for the magnetic free layer include, but are not limited to, alloys and/or multilayers of cobalt, iron, alloys of cobalt-iron, nickel, alloys of nickel-iron, and alloys of cobalt-iron-boron. The magnetic free layer can have a thickness from 0.3 nm to 3 nm; although other thicknesses are possible and can be used as the thickness of the magnetic free layer. In some embodiments, the magnetic free layer can include a lower magnetic free layer and an upper magnetic free layer that are spaced apart by a metal spacer.

The tunnel barrier layer 24 is composed of an insulator material and is formed at such a thickness as to provide an appropriate tunneling resistance. Exemplary materials for the tunnel barrier layer 24 include magnesium oxide, aluminum oxide, and titanium oxide, or materials of higher electrical tunnel conductance, such as semiconductors or low-bandgap insulators. The thickness of the tunnel barrier layer 24 will depend on the material selected. In one example, the tunnel barrier layer 24 can have a thickness from 0.5 nm to 1.5 nm; although other thicknesses are possible as long as the thickness of the tunnel barrier layer 24 provides an appropriate tunneling resistance.

The magnetic reference layer has a fixed magnetization. The magnetic reference layer is composed of a metal or metal alloy that includes one or more metals exhibiting high spin polarization. In alternative embodiments, exemplary metals for the formation of the magnetic reference layer include iron, nickel, cobalt, chromium, boron, and manganese. Exemplary metal alloys may include the metals exemplified by the above. In another embodiment, the magnetic reference layer may be a multilayer arrangement having (1) a high spin polarization region formed from of a metal and/or metal alloy using the metals mentioned above, and (2) a region constructed of a material or materials that exhibit strong perpendicular magnetic anisotropy (strong PMA). Exemplary materials with strong PMA that may be used include a metal such as cobalt, nickel, platinum, palladium, iridium, or ruthenium, and may be arranged as alternating layers. The strong PMA region may also include alloys that exhibit strong PMA, with exemplary alloys including cobalt-iron-terbium, cobalt-iron-gadolinium, cobalt-chromium-platinum, cobalt-platinum, cobalt-palladium, iron-platinum, and/or iron-palladium. The alloys may be arranged as alternating layers. In one embodiment, combinations of these materials and regions may also be employed. The magnetic reference layer can have a thickness from 0.3 nm to 3 nm; although other thicknesses are possible and can be used as the thickness of the magnetic reference layer.

In some embodiments of the present application, the MTJ structure is a bottom pinned MTJ structure. In such an embodiment, the lower magnetic stack 22 includes a magnetic reference layer, while the upper magnetic stack 26 includes a magnetic free layer. In other embodiments of the present application, the MTJ structure is a top pinned MTJ structure. In such an embodiment, the lower magnetic stack 22 includes a magnetic free layer, while the upper magnetic stack 26 includes a magnetic reference layer.

The MTJ structure described above can be formed by a PVD process in which shadowing occurs in the gap 20 because of the overhang of the second dielectric material layer 16. In the bottom of opening 18 and on top of the electrically conductive structure 12, the MTJ structure is pyramidal (i.e., is a shape of a pyramid).

Referring now to FIGS. 6A-6B, there are illustrated in FIG. 4 after forming a MTJ structure in the at least one opening and on physically exposed surfaces of the second dielectric material layer of the bilayer dielectric material mask, wherein a tunnel barrier layer 24 of the MTJ structure is formed along a physically exposed sidewall of the recessed first dielectric material layer. The MTJ structure illustrated in this embodiment includes materials as mentioned above for the MTJ structure illustrated in FIGS. 5A-5B. The MTJ structure illustrated in this embodiment is formed by PVD as well; in this embodiment, the PVD has not been optimized to prevent the formation of the tunnel barrier layer 24 in the gap 20.

Referring now to FIG. 7, there is illustrated the exemplary structure shown in FIG. 5A after forming a sacrificial dielectric material layer 28. The sacrificial dielectric material layer 28 is composed of a sacrificial dielectric material such as, for example, silicon nitride or silicon oxynitride. The sacrificial dielectric material layer 28 is formed by a deposition process including, for example, CVD, PECVD, and ALD. In some embodiments of the present application (depending on the first thickness of the first dielectric material layer 14 and the thickness of the sacrificial dielectric material layer 28), a pinch-off region 30 that is devoid of the sacrificial dielectric material is formed in the gap 20. The formation of this pinch-off region 30 makes downstream processing much easier as compared to instances in which no pinch-off region 30 is formed. The thickness of the sacrificial dielectric material layer 28 can be from 5 nm to 100 nm.

Referring now to FIG. 8, there is illustrated the exemplary structure shown in FIG. 7 after removing the sacrificial dielectric material layer 28 from all horizontal surfaces of the MTJ structure including the topmost surface of the MTJ structure that is located on the bilayer dielectric material mask and a topmost surface of the MTJ structure that is located in the at least one opening 18. The removal of the sacrificial dielectric material layer 28 from all horizontal surfaces can be performed utilizing an etch back process such as, for example, reactive ion etching using a fluorine containing plasma. The removal of the horizontal component of the sacrificial dielectric material layer 28 by this etch back process does not affect the magnetic property of the upper magnetic stack of the MTJ structure.

Referring now to FIG. 9, there is illustrated the exemplary structure shown in FIG. 8 after forming a top electrode 32, the top electrode 32 having at seam 33 located in an area of the top electrode 32 that is formed in the at least one opening 18. The top electrode 32 is composed of an electrically conductive material such as, for example, Ta. TaN, Ti, TiN, Ru, RuN, RuTa, RuTaN, Co, CoWP, CON, W. WN or any combination (e.g., TiN/W) thereof. The top electrode 32 can be formed utilizing a conformal deposition process. In one example, the top electrode 32 is formed by CVD, PECVD or ALD. In another embodiment, the top electrode is formed by PVD, followed by CVD or ALD. It is noted that seam 33 is typically formed in a middle portion of the top electrode 32 that is formed in the opening 18, and the seam 33 can extend outwards in a lower portion of the top electrode 32 from the middle portion to the sidewalls of the top electrode 32. This seam 33 is a detectable feature of the top electrode 32.

Referring now to FIG. 10, there is illustrated the exemplary structure shown in FIG. 9 after removing the top electrode 32 from above the bilayer dielectric material mask, wherein during the removal of the top electrode 32, the MTJ structure that is present on the bilayer dielectric material mask is also removed. The removal of this overburdened portion of the top electrode 32 and the overburdened portion of the MTJ structure can be performed utilizing a planarization process such as, for example, CMP. At this point of the present application, the remaining top electrode 32 has a topmost surface that is coplanar with a topmost surface of the bilayer dielectric material mask.

Referring now to FIG. 11, there is illustrated the exemplary structure shown in FIG. 10 after recessing the top electrode 32 that is present in the at least one opening 18. The recessing of the top electrode 32 reduces the height of the top electrode 32 that remains in the opening 18; the remaining top electrode 32 still contains seam 33. The recessing can be performed utilizing an etching process that is selective in removing the top electrode 32. After recessing, an upper portion of the sacrificial dielectric material layer 28 that remains in the opening 18 is physically exposed as is shown in FIG. 11 and a gap (not labeled) is formed above the remaining top electrode 32 and between sidewalls of the physically exposed upper portion of the sacrificial dielectric material layer 28.

Referring now to FIG. 12, there is illustrated the exemplary structure shown in FIG. 11 after forming a dielectric cap 34 on the recessed (i.e., remaining) top electrode 32 and in the gap mentioned above in regard to the exemplary structure shown in FIG. 11. Dielectric cap 34 is composed of a dielectric material that is typically, but not necessarily always, compositionally the same as the sacrificial dielectric material that provides the sacrificial dielectric material layer 28. In some embodiments, both the dielectric cap 34 and the sacrificial dielectric material layer 28 are composed of silicon nitride. Dielectric cap 34 can be formed by a deposition process (e.g., CVD, PECVD or ALD) followed by a planarization process such as, for example, CMP. The formation of the dielectric cap 34 on the remaining top electrode 32 protects the top electrode 32 during subsequently performed etching processes and thus preventing any corner rounding of the top electrode 32.

Referring now to FIG. 13, there is illustrated the exemplary structure shown in FIG. 12 after removing the second dielectric material layer 16 of the bilayer dielectric material mask. The removal of the second dielectric material layer 16 of the bilayer dielectric material mask includes an etching process (typically chemical wet etching) that is selective in removing the second dielectric material layer 16. Note that no damage to the top electrode 32 occurs during this step of the present application since the top electrode 32 is protected by both the sacrificial dielectric material layer 28 and the dielectric cap 34.

Referring now to FIG. 14, there is illustrated the exemplary structure shown in FIG. 13 after removing the MTJ structure from a sidewall of the sacrificial dielectric material layer 28. The removal of the MTJ structure from the sidewall of the sacrificial dielectric material layer 28 can be performed utilizing an etching process that is selective in removing the materials that provide the MTJ structure; the top electrode 32 is still protected by both the sacrificial dielectric material layer 28 and the dielectric cap 34 during this step of the present application. In one example, hexafluoroacetylacetone (HFAc) mixed with isopropanol can be used to remove the MTJ structure from the sidewall of the sacrificial dielectric material layer 28

Referring now to FIG. 15, there is illustrated the exemplary structure shown in FIG. 14 after removing the dielectric cap 34, the sacrificial dielectric material layer 28 and the recessed first dielectric material layer 14P of the bilayer dielectric material mask. The removal of the dielectric cap 34, the sacrificial dielectric material layer 28 and the recessed first dielectric material layer 14P can be performed utilizing one or more etching processes. The one or more etching processes can include dry etching, chemical wet etching or a combination of dry etching and chemical wet etching. In some embodiments (not shown), an upper portion of the interconnect dielectric material layer 10 can be removed during this step of the present application. This step revels the top electrode 32 having seam 33 and the MTJ structure including the lower magnetic stack 22, the tunnel barrier layer 24 and the upper magnetic stack 26 that is present on top of the electrically conductive structure 12. It is again noted that this MTJ structure has a pyramid shape.

Referring now to FIG. 16, there is illustrated the exemplary structure shown in FIG. 15 after removing the upper magnetic layer stack 26 and the tunnel barrier layer 24 of the MTJ structure to physically expose an end portion (see dotted region in FIG. 16) of the lower magnetic stack 22 of the MTJ structure. The removal of the upper magnetic layer stack 26 and the tunnel barrier layer 24 of the MTJ structure can be performed utilizing a chemical wet etching process in which an acid such as, for example, hydrochloric (HCl) is used. In one example, the chemical etchant is dilute HCl or a mixture of $H_2O$—HCl—$H_2O_2$. This step of the present application cleans the remaining MTJ structure and prevents shorting of the remaining MTJ structure. End portions of the lower magnetic stack 22 are now devoid of the tunnel barrier layer 24 and the upper magnetic stack 26.

The remaining MTJ structure is still pyramidal and the lower magnetic stack 22 has a first critical dimension, CD1, the tunnel barrier layer 24 has a second critical dimension, CD2, and the upper magnetic stack has a third critical dimension, CD, wherein CD1 is greater than CD2 and CD3, and wherein CD2 is greater than, or equal to, CD3. In the present application, the top electrode 32 has a fourth critical dimension, CD4, wherein CD4 is less than at least CD1. CD4 can be equal to, or less than, CD2 and CD3. In the present application, the critical dimension, CD, is equivalent to a lateral width of the specified element/material.

Referring now to FIG. 17, there is illustrated the exemplary structure shown in FIG. 6A after performing the processing steps mentioned above in FIGS. 8-12, and then removing the second dielectric material layer 16 of the bilayer dielectric material mask. The removal of the second dielectric material layer 16 of the bilayer dielectric material mask includes an etching process as mentioned above in providing the exemplary structure shown in FIG. 13. Note that no damage to the top electrode 32 occurs during this step of the present application since the top electrode 32 is protected by both the sacrificial dielectric material layer 28 and the dielectric cap 34. Like the previous embodiment, the MTJ structure includes a lower magnetic stack 22, tunnel barrier 24 and an upper magnetic stack 26.

Referring now to FIG. 18, there is illustrated the exemplary structure shown in FIG. 17 after removing the MTJ structure from a sidewall of the sacrificial dielectric material layer 28. This removal step of the present application is the same as that described above for providing the exemplary structure shown in FIG. 14.

Referring now to FIG. 19, there is illustrated the exemplary structure shown in FIG. 18 after removing the dielectric cap 34, the sacrificial dielectric material layer 28 and the recessed first dielectric material layer 14P of the bilayer dielectric material mask. The removal step is the same as that described above for providing the exemplary structure shown in FIG. 15. This step revels the top electrode 32 having seam 33 and the MTJ structure that is present on top of the electrically conductive structure 12, as well as portions of the tunnel barrier layer 24 that were formed along the sidewall of the recessed first dielectric material layer 14P; these portions of the tunnel barrier layer 24 that are physically exposed are referred to hereafter as tunnel barrier stringers.

Referring now to FIG. 20, there is illustrated the exemplary structure shown in FIG. 19 after removing the upper magnetic layer stack 26 and the tunnel barrier layer 24 of the MTJ structure to physically expose a lower magnetic stack 22 of the MTJ structure; note that this removal steps also removes the tunnel barrier stringers mentioned above. This removal step of the present application includes the chemical wet etch process that was described above in providing the exemplary structure shown in FIG. 15. The structure shown in FIG. 20 is similar to the structure shown in FIG. 16 above. The remaining MTJ structure is still pyramidal and the lower magnetic stack 22 has a first critical dimension, CD1, the tunnel barrier layer 24 has a second critical dimension, CD2, and the upper magnetic stack has a third critical dimension, CD, wherein CD1 is greater than CD2 and CD3, and wherein CD2 is greater than, or equal to, CD3. In the present application, the top electrode 32 has a fourth critical dimension, CD4, wherein CD4 is less than at least CD1. CD4 can be equal to, or less than, CD2 and CD3. End portions of the lower magnetic stack 22 are now devoid of the tunnel barrier layer 24 and the upper magnetic stack 26.

Referring now to FIG. 21, there is illustrated the exemplary structure shown in FIG. 10 after removing the bilayer dielectric material mask (including the second dielectric material layer 16 and the recessed first dielectric material layer 14P), the dielectric cap 34, and a physically exposed portion of the sacrificial dielectric material layer 28. This removal step can include one of more etching processes including chemical wet etching only or a combined dry and chemical wet etching. Note that gap 36 is formed beneath the MTJ structure and sacrificial dielectric material layer 28 that remains on the sidewalls of the top electrode 32.

Referring now to FIG. 22, there is illustrated the exemplary structure shown in FIG. 21 after removing the upper magnetic layer stack 26 and the tunnel barrier layer 28 of the MTJ structure to physically expose a lower magnetic stack 22 of the MTJ structure that is present on top of the electrically conductive structure 12. This removal step of the present application includes the chemical wet etch process that was described above in providing the exemplary structure shown in FIG. 15. It is noted that this chemical wet etch process also removes the lower magnetic stack 22, and the tunnel barrier layer 24 and a portion of the upper magnetic stack 26 that are present on the sidewalls of the sacrificial dielectric material layer 28, and a residual magnetic stack 27 can remain. The residual magnetic stack 27 includes magnetic materials from MTJ structure that are not removed during this step of the present application. In one example, the residual magnetic stack 27 is typically composed of a platinum layer and other layers that are under the platinum layer. In this embodiment, a lower sidewall portion of the top electrode 32 is physically exposed, and an upper sidewall portion of the top electrode 32 is protected by the sacrificial dielectric material layer 28. The sacrificial dielectric material layer 28 can have the residual magnetic stack 27 located on a sidewall thereof. The residual magnetic stack 27 is spaced apart from the upper magnetic stack 28 that is present in the MTJ structure.

The remaining MTJ structure that is located on the electrically conductive structure 12 is still pyramidal and the lower magnetic stack 22 has a first critical dimension, CD1, the tunnel barrier layer 24 has a second critical dimension, CD2, and the upper magnetic stack has a third critical dimension, CD, wherein CD1 is greater than CD2 and CD3, and wherein CD2 is greater than, or equal to, CD3. In the present application, the top electrode 32 has a fourth critical dimension, CD4, wherein CD4 is less than at least CD1. CD4 can be equal to, or less than, CD2 and CD3. End portions of the lower magnetic stack 22 are now devoid of the tunnel barrier layer 24 and the upper magnetic stack 26.

It is noted that in any other embodiments of the present application described herein above, the MTJ structure and the top electrode are not formed utilizing an ion beam etching process. Instead, the MTJ structure is formed by deposition utilizing the bilayer dielectric material mask as a shadow mask, the top electrode is formed by deposition. Also, and in any of the embodiments of the present application, no corner rounding of the top electrode 32 which has seam 33 is observed. In the present application, the top electrode 32 has a constant critical dimension (e.g., CD4 mentioned above) throughout the entirety of the structure.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A memory structure comprising:
    a magnetic tunnel junction (MTJ) structure located on an electrically conductive structure, the MTJ structure comprising a lower magnetic stack and an upper magnetic stack that are spaced apart by a tunnel barrier layer;
    a top electrode located on the upper magnetic stack of the MTJ structure, wherein the top electrode contains a seam; and
    a sacrificial dielectric material layer protecting an upper portion of a sidewall of the top electrode, wherein the sacrificial dielectric material layer has a residual magnetic stack located on a sidewall thereof.

2. The memory structure of claim 1, wherein the top electrode has a constant width throughout an entirety of the top electrode.

3. The memory structure of claim 1, wherein the electrically conductive structure is embedded in an interconnect dielectric material layer, and the electrically conductive structure and the interconnect dielectric material layer collectively form an interconnect level.

4. The memory structure of claim 1, wherein the MTJ structure is pyramidal in shape.

5. The memory structure of claim 4, wherein the lower magnetic stack of the MTJ structure has a first width, the tunnel barrier layer of the MTJ structure has a second width, and the upper magnetic stack of the MTJ structure has a third width, wherein the first width is greater than the second width and the third width, and the second width is greater than, or equal to, the third width.

6. The memory structure of claim 5, wherein the top electrode has a fourth width, wherein the fourth width is less than the first width, and the fourth width is equal to, or less than, the second width and the third width.

7. The memory structure of claim 1, wherein the MTJ structure is a top pinned MTJ structure, and the lower magnetic stack comprises a magnetic free layer, and the upper magnetic stack comprises a magnetic reference layer.

8. The memory structure of claim 1, wherein the MTJ structure is a bottom pinned MTJ structure, and the lower magnetic stack comprises a magnetic reference layer, and the upper magnetic stack comprises a magnetic free layer.

9. The memory structure of claim 1, wherein the lower magnetic stack further comprises a bottom electrode, the bottom electrode is located in close proximity to the electrically conductive structure.

10. The memory structure of claim 1, wherein the lower magnetic stack has an end portion that is devoid of the tunnel barrier layer and the upper magnetic stack.

11. The memory structure of claim 1, wherein the seam is present in a middle portion of the top electrode.

12. The memory structure of claim 11, wherein the seam extends outwards from the middle portion to the sidewall of the top electrode.

13. A memory structure comprising:
    a magnetic tunnel junction (MTJ) structure located on an electrically conductive structure, the MTJ structure comprising a lower magnetic stack and an upper magnetic stack that are spaced apart by a tunnel barrier layer;
    a top electrode located on the upper magnetic stack of the MTJ structure, wherein the top electrode contains a seam; and
    a sacrificial dielectric material layer protecting an upper portion of a sidewall of the top electrode, wherein a gap is present between a bottommost surface of the sacrificial dielectric material layer and a topmost surface of the MTJ structure and the sacrificial dielectric material layer has a residual magnetic stack located on a sidewall thereof.

* * * * *